US012592849B2

(12) United States Patent
Yang et al.

(10) Patent No.: US 12,592,849 B2
(45) Date of Patent: Mar. 31, 2026

(54) TERMINATION CIRCUIT OF RECEIVER

(71) Applicant: Realtek Semiconductor Corp.,
HsinChu (TW)

(72) Inventors: Jun Yang, Suzhou (CN); Jian Liu,
Suzhou (CN)

(73) Assignee: Realtek Semiconductor Corp.,
HsinChu (TW)

( * ) Notice: Subject to any disclaimer, the term of this
patent is extended or adjusted under 35
U.S.C. 154(b) by 22 days.

(21) Appl. No.: 18/642,702

(22) Filed: Apr. 22, 2024

(65) Prior Publication Data

US 2024/0364312 A1      Oct. 31, 2024

(30) Foreign Application Priority Data

Apr. 25, 2023      (CN) .......................... 202310457095.9

(51) Int. Cl.
| | |
|---|---|
| *H04L 25/02* | (2006.01) |
| *H03H 11/28* | (2006.01) |
| *H03K 19/00* | (2006.01) |
| *H03K 19/0175* | (2006.01) |

(52) U.S. Cl.
CPC ......... *H04L 25/0278* (2013.01); *H03H 11/28*
(2013.01); *H03K 19/0005* (2013.01); *H03K*
*19/017545* (2013.01)

(58) Field of Classification Search
CPC ................................................ H03H 11/28–30
See application file for complete search history.

(56) References Cited

U.S. PATENT DOCUMENTS

| | | | | |
|---|---|---|---|---|
| 6,886,065 | B2 * | 4/2005 | Sides .................. | H04L 25/0278 |
| | | | | 710/305 |
| 8,461,896 | B2 * | 6/2013 | Zhuang .................... | H04B 3/30 |
| | | | | 375/317 |
| 8,599,966 | B2 * | 12/2013 | Beukema ............ | H04L 25/0296 |
| | | | | 330/136 |
| 9,083,574 | B2 * | 7/2015 | Scouten .............. | H04L 25/0292 |
| 9,335,370 | B2 * | 5/2016 | Atwood ............. | G01R 31/2884 |
| 9,602,315 | B2 * | 3/2017 | Islam ...................... | H04L 25/06 |
| 10,505,542 | B2 * | 12/2019 | Finn ............... | H03K 19/018514 |
| 10,862,521 | B1 * | 12/2020 | Raviprakash ............ | H03H 7/25 |
| 11,515,943 | B2 * | 11/2022 | Zhang ............... | H04Q 11/0067 |

(Continued)

FOREIGN PATENT DOCUMENTS

CN              110781114 A      2/2020

*Primary Examiner* — Thomas J. Hiltunen
(74) *Attorney, Agent, or Firm* — Winston Hsu

(57)      ABSTRACT
A termination circuit of a receiver is provided. The termi-
nation circuit includes an input resistor, a capacitor, a first
resistor, a second resistor, a third resistor and a bias signal
generator. The input resistor is coupled between an input
terminal of the termination circuit and a first reference
voltage. The capacitor is coupled between a first node of the
termination circuit and an output terminal of the termination
circuit. The first resistor is coupled between the first node
and a second node of the termination circuit. The second
resistor is coupled between the second node and the output
terminal. The third resistor is coupled between the second
node and a control terminal of the termination circuit. In
addition, the bias signal generator is coupled to the control
terminal, and generates a control signal positively correlated
with a second reference voltage to the control terminal.

10 Claims, 8 Drawing Sheets

(56)                    References Cited

U.S. PATENT DOCUMENTS

2012/0133414 A1*   5/2012   Zhuang  ............ H03K 3/356113
                                                327/333
2016/0173299 A1*   6/2016   Islam  ...................... H04L 25/06
                                                375/232
2018/0337659 A1*   11/2018   Mu  .......................... H04B 1/40

* cited by examiner

TERMINATION CIRCUIT OF RECEIVER

BACKGROUND OF THE INVENTION

1. Field of the Invention

The present invention is related to termination circuits, and more particularly, to a termination circuit of a receiver such as a Serializer/Deserializer (SerDes).

2. Description of the Prior Art

When a receiver receives a signal, the signal typically undergoes equalization processing, and the processed signal is then transmitted to backend circuits. Under certain conditions, directly transmitting the signal from the receiver to a linear equalizer may introduce some problems.

When a medium configured for transmitting the signal between devices, such as a cable, has great loss, preliminary amplification upon the signal before being transmitted to the linear equalizer is required. Thus, under this condition, a circuit in front of the linear equalizer needs to provide a low gain in a low frequency band (e.g. providing a low direct current (DC) gain) and provide a high gain in a high frequency band (e.g. providing a high alternating current (AC) gain).

In addition, a response of the linear equalizer is typically designed according to requirements of a high data rate operation, which may cause the problem of over equalization (e.g. too much gain compensation in the high frequency band) when the linear equalizer operates at a low data rate. In order to prevent the over equalization, the high frequency band gain provided by the linear equalizer is unwanted when there is less front-end insertion loss. Under this condition, the circuit in front of the linear equalizer needs to provide a high gain in the low frequency band (e.g. providing a high DC gain) and provide a low gain in the high frequency band (e.g. providing a low AC gain), in order to provide an effect similar to low pass filtering.

When the signal received by the receiver has less loss, the signal has a big swing. Under this condition, the circuit in front of the linear equalizer needs to provide a low gain in the low frequency band (e.g. providing a low DC gain) and provide a low gain in the high frequency band (e.g. providing a low AC gain), in order to prevent the linear equalizer from being damaged when the signal swing is too big, or prevent transistors within backend circuits from operating in unwanted regions.

In addition, when a common mode voltage of the signal received by the receiver is different from a common mode voltage of the linear equalizer, the circuit in front of the linear equalizer needs to be equipped with a function of adjusting the common mode voltage. It is hard to adjust the common mode voltage without changing the DC gain and the AC gain, however, making it hard to optimize an overall performance. More particularly, when a supply voltage of the linear equalizer is changed, the optimal operation region may change. If the common mode voltage remains unchanged when the supply voltage of the linear equalizer changes, it cannot be ensured that transistors within the linear equalizer will operate in the optimal regions.

All this considered, there is a need for a novel architecture which can enable the DC gain, the AC gain and an output common mode voltage provided by the circuits in front of the linear equalizer to be respectively controlled without affecting each other, and more particularly, which can enable the output common mode voltage to track the supply voltage of the linear equalizer.

SUMMARY OF THE INVENTION

An objective of the present invention is to provide a termination circuit of a receiver, which can make a direct current (DC) gain, an alternating current (AC) gain and an output common mode voltage of the termination circuit be able to be separately controlled or adjusted without introducing any side effect or in a way that is less likely to introduce side effects.

At least one embodiment of the present invention provides a termination circuit of a receiver. The termination circuit comprises a positive input resistor, a negative input resistor, a positive first capacitor, a negative first capacitor, a positive first resistor, a negative first resistor, a positive second resistor, a negative second resistor, a positive third resistor, a negative third resistor and a bias signal generator. In detail, the positive input resistor is coupled between a positive input terminal of the termination circuit and a first reference voltage terminal, and the negative input resistor is coupled between a negative input terminal of the termination circuit and the first reference voltage terminal. The positive first capacitor is coupled between a positive first node of the termination circuit and a positive output terminal of the termination circuit, and the negative first capacitor is coupled between a negative first node of the termination circuit and a negative output terminal of the termination circuit. The positive first resistor is coupled between the positive first node and a positive second node of the termination circuit, and the negative first resistor is coupled between the negative first node and a negative second node of the termination circuit. The positive second resistor is coupled between the positive second node and the positive output terminal, and the negative second resistor is coupled between the negative second node and the negative output terminal. The positive third resistor is coupled between the positive second node and a positive control terminal of the termination circuit, and the negative third resistor is coupled between the negative second node and a negative control terminal of the termination circuit. In addition, the bias signal generator is coupled to the positive control terminal and the negative control terminal, and is configured to generate a positive control signal and a negative control signal to be transmitted to the positive control terminal and the negative control terminal, wherein the positive control signal and the negative control signal are positively correlated with a voltage level of a second reference voltage terminal.

At least one embodiment of the present invention provides a termination circuit of a receiver. The termination circuit comprises a positive input resistor, a negative input resistor, a positive first capacitor, a negative first capacitor, a positive first resistor, a negative first resistor, a positive second resistor, a negative second resistor, a positive third resistor, a negative third resistor, a positive fourth resistor, a negative fourth resistor and a fifth resistor. In detail, the positive input resistor is coupled between a positive input terminal of the termination circuit and a first reference voltage terminal, and the negative input resistor is coupled between a negative input terminal of the termination circuit and the first reference voltage terminal. The positive first capacitor is coupled between a positive first node of the termination circuit and a positive output terminal of the termination circuit, and the negative first capacitor is coupled between a negative first node of the termination circuit and a negative output terminal of the termination circuit. The positive first resistor is coupled between the positive first node and a positive second node of the termination circuit, and the negative first resistor is coupled between the negative first node and a negative second node of the termination circuit. The positive second resistor is coupled between the positive second node and the positive output terminal, and the negative second resistor is coupled between the negative second node and the negative output terminal. The positive third resistor is coupled between the positive second node and a positive control terminal of the termination circuit, and the negative third resistor is coupled between the negative second node and a negative control terminal of the termination circuit. In addition, the positive fourth resistor is coupled between the positive input terminal and the positive first node, the negative fourth resistor is coupled between the negative input terminal and the negative first node, and the fifth resistor is coupled between the positive first node and the negative first node.

At least one embodiment of the present invention provides a termination circuit of a receiver. The termination circuit comprises a positive input resistor, a negative input resistor, a positive first capacitor, a negative first capacitor, a positive first resistor, a negative first resistor, a positive second resistor, a negative second resistor, a positive third resistor, a negative third resistor and a fourth resistor. In detail, the positive input resistor is coupled between a positive input terminal of the termination circuit and a first reference voltage terminal, and the negative input resistor is coupled between a negative input terminal of the termination circuit and the first reference voltage terminal. The positive first capacitor is coupled between a positive first node of the termination circuit and a positive output terminal of the termination circuit, and the negative first capacitor is coupled between a negative first node of the termination circuit and a negative output terminal of the termination circuit. The positive first resistor is coupled between the positive first node and a positive second node of the termination circuit, and the negative first resistor is coupled between the negative first node and a negative second node of the termination circuit. The positive second resistor is coupled between the positive second node and the positive output terminal, and the negative second resistor is coupled between the negative second node and the negative output terminal. The positive third resistor is coupled between the positive second node and a positive control terminal of the termination circuit, and the negative third resistor is coupled between the negative second node and a negative control terminal of the termination circuit. In addition, the fourth resistor is coupled between the positive second node and the negative second node.

The termination circuit provided by the embodiment of the present invention can selectively adjust the DC gain and the AC gain via connecting components such as resistor(s) and capacitor(s) to different nodes. For example, the termination circuit can concurrently reduce the DC gain and the AC gain without affecting the output common mode voltage. In another example, the termination circuit can reduce one of the DC gain and the AC gain only without affecting the output common mode voltage. More particularly, the termination circuit can utilize the bias signal generator to control the control terminals of the termination circuit, in order to make the output common mode voltage track a supply voltage of a backend circuit (e.g. a linear equalizer at the backend of the termination circuit).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
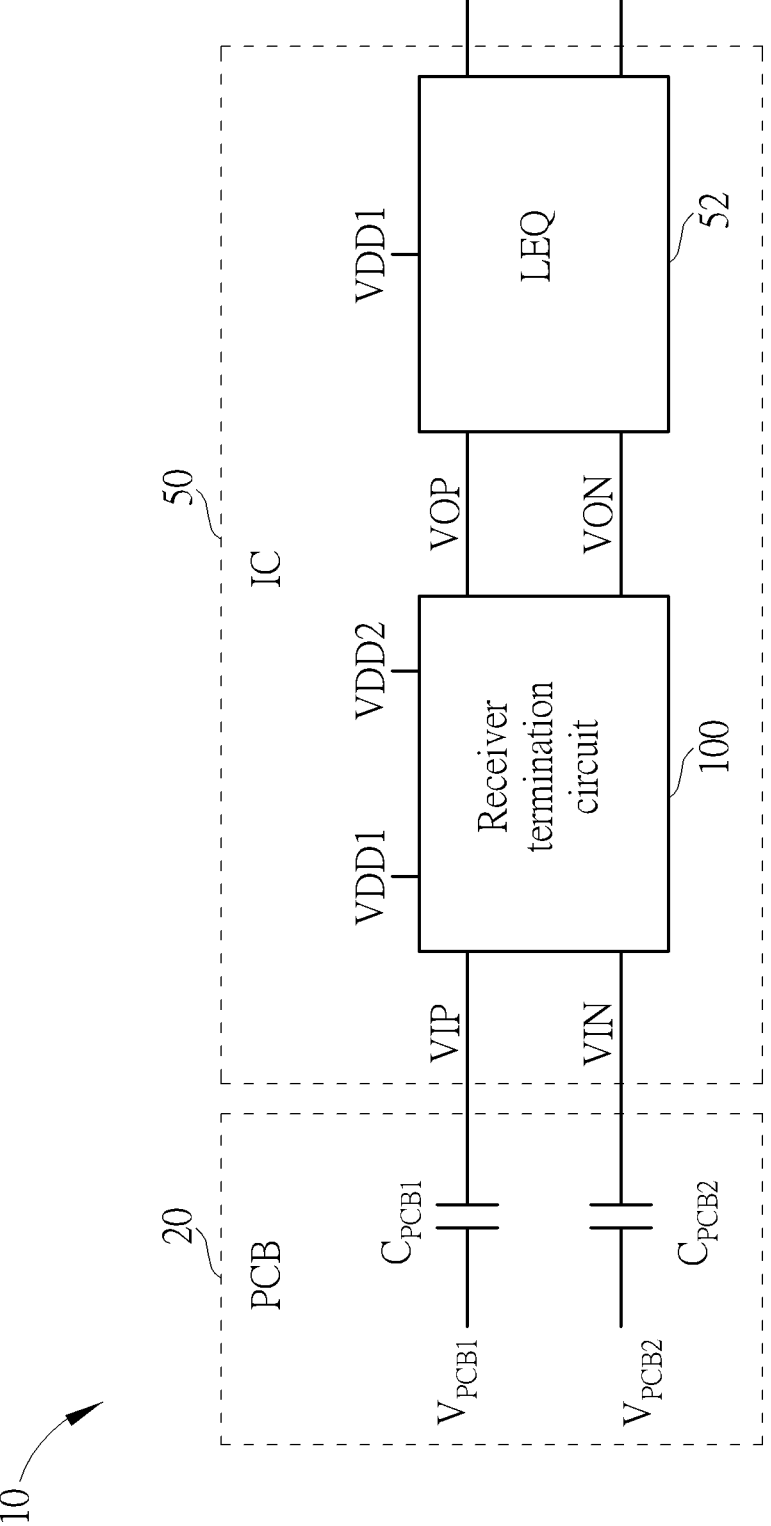
FIG. 1 is a diagram illustrating a receiver according to an embodiment of the present invention.

FIG. 1 is a diagram illustrating a receiver 10 according to an embodiment of the present invention, where examples of the receiver 10 include, but are not limited to a Serializer/Deserializer (SerDes) receiving interface circuit. As shown in FIG. 1, the receiver 10 may comprise alternating current (AC) coupled capacitors $C_{PCB1}$ and $C_{PCB2}$ which is welded on a printed circuit board (PCB) 20, and a linear equalizer (LEQ) 52 and receiver termination circuit 100 which are implemented inside an integrated circuit (IC) 50. In this embodiment, when the receiver 10 receives signals {$V_{PCB1}$, $V_{PCB2}$}, the receiver 10 may extract a portion of AC signals (e.g. {VIP, VIN} within the signals {$V_{PCB1}$, $V_{PCB2}$} via the AC coupled capacitors $C_{PCB1}$ and $C_{PCB2}$, and the receiver termination circuit 100 may perform direct current (DC) gain, AC gain and/or common mode voltage adjustment upon the signals {VIP, VIN} to generate signals {VOP, VON} for the LEQ 52 to proceed with subsequent equalization processing. More particularly, a supply voltage of the receiver termination circuit 100 is VDD2, and a supply voltage of the LEQ 52 is VDD1, where the receiver termination circuit 100 may control a common mode voltage of the signals {VOP, VON} according to the supply voltage VDD1 of the LEQ 52.

Figure 2:
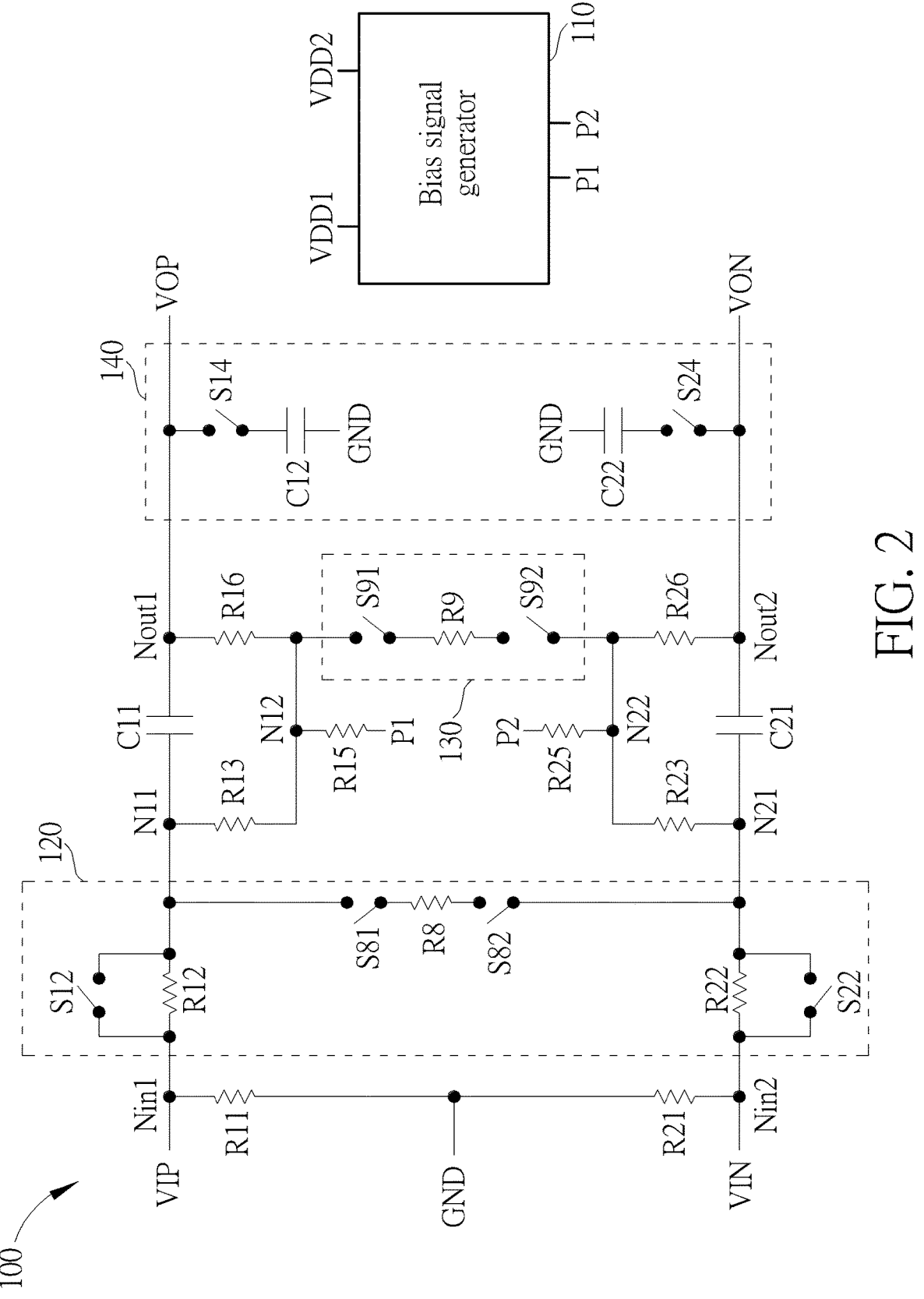
FIG. 2 is a diagram illustrating a termination circuit of a receiver according to an embodiment of the present invention.

FIG. 2 is a diagram illustrating the receiver termination circuit 100 of the receiver 10 according to an embodiment of the present invention. As shown in FIG. 2, the receiver termination circuit 100 comprises a positive input resistor such as a resistor R11, a negative input resistor R21 (e.g. the resistors R11 and R21 may have a same resistance), a positive first capacitor such as a capacitor C11, a negative first capacitor such as a capacitor C21 (e.g. the capacitors C11 and C21 may have a same capacitance), a positive first resistor such as a resistor R13, a negative first resistor such as a resistor R23 (e.g. the resistors R13 and R23 may have a same resistance), a positive second resistor such as a resistor R16, a negative second resistor such as a resistor R26 (e.g. the resistors R16 and R26 may have a same resistance), a positive third resistor such as a resistor R15, and a negative third resistor such as a resistor R25 (e.g. the resistors R15 and R25 may have a same resistance). In detail, the resistor R11 is coupled between a positive input terminal Nin1 and a first reference voltage terminal (e.g. a terminal providing a ground voltage GND), and the resistor R21 is coupled between a negative input terminal Nin2 of the receiver termination circuit 100 and the ground voltage GND. The capacitor C11 is coupled between anode N11 of the receiver termination circuit 100 and a positive output terminal Nout1 of the receiver termination circuit 100, and the capacitor C21 is coupled between a node N21 of the receiver termination circuit 100 and a negative output terminal Nout2 of the receiver termination circuit 100. The resistor R13 is coupled between the node N11 and a node N12 of the receiver termination circuit 100, and the resistor R23 is coupled between the node N21 and a node N22 of the receiver termination circuit 100. The resistor R16 is coupled between the node N12 and the positive output terminal Nout1, and the resistor R26 is coupled between the node N22 and the negative output terminal Nout2. The resistor R15 is coupled between the node N12 and a positive control terminal P1 of the receiver termination circuit 100, and the resistor R25 is coupled between the node N22 and a negative control terminal P2 of the receiver termination circuit 100.

Based on a network formed by the above passive devices (e.g. resistors and capacitors), the receiver termination circuit 100 may further comprise a bias signal generator 110 and gain adjustment circuits 120, 130 and 140. The bias signal generator 110 is coupled to the positive control terminal P1 and the negative control terminal P2, and is configured to generate a positive control signal and a negative control signal respectively transmitted to the positive control terminal and the negative control terminal P2, where the positive control signal and the negative control signal are positively correlated with a voltage level of the supply voltage VDD1. In addition, the gain adjustment circuit 120 may concurrently adjust the DC gain and the AC gain of the receiver termination circuit 100 without affecting the common mode voltage of the signals {VOP, VON}. The gain adjustment circuit 130 may adjust the DC gain of the receiver termination circuit 100 without affecting the common mode voltage of the signals {VOP, VON} and the AC gain of the receiver termination circuit 100. The gain adjustment circuit 140 may adjust the AC gain of the receiver termination circuit 100 without affecting the common mode voltage of the signals {VOP, VON} and the DC gain of the receiver termination circuit 100.

It should be noted that the receiver termination circuit 100 does not have to comprise all of the bias signal generator 110 and the gain adjustment circuits 120, 130 and 140. In some embodiments, the receiver termination circuit 100 may comprise one of the bias signal generator 110 and the gain adjustment circuits 120, 130 and 140 without comprising the other three circuits. In some embodiments, the receiver termination circuit 100 may comprise two of the bias signal generator 110 and the gain adjustment circuits 120, 130 and 140 without comprising the other two circuits. In some embodiments, the receiver termination circuit 100 may comprise three of the bias signal generator 110 and the gain adjustment circuits 120, 130 and 140 without comprising the other circuit.

In this embodiment, the gain adjustment circuit 120 may comprise a positive fourth resistor such as a resistor R12, a negative fourth resistor such as a resistor R22 (e.g. the resistors R12 and R22 may have a same resistance), and a fifth resistor such as a resistor R8. When the gain adjustment circuit 120 is enabled, the resistor R12 is coupled between the positive input terminal Nin1 and the node N11, the resistor R22 is coupled between the negative input terminal Nin2 and the node N21, and the resistor R8 is coupled between the node N11 and N21. When the gain adjustment circuit 120 is disabled, the positive input terminal Nin1 is short-circuited to the node N11, the negative input terminal Nin2 is short-circuited to the node N21, and the node N11 is prevented from connecting to the node N21 via the resistor R8. In this embodiment, the gain adjustment circuit 120 may comprise switches S12, S22, S81 and S82 for controlling whether to enable the gain adjustment circuit 120. For example, when the switches S21 and S22 are turned off and the switches S81 and S82 are turned on, the gain adjustment circuit 120 may be enabled. When the switches S12 and S22 are turned on and the switches S81 and S82 are turned off, the gain adjustment circuit 120 may be disabled. It should be noted that switches for controlling whether to enable the gain adjustment circuit 120 do not have to be implemented in the exact way of the switches S12, S22, S81 and S82 shown in FIG. 2. As long as a network within the gain adjustment circuit 120 has a corresponding configuration to those mentioned above under the conditions of being enabled and disabled, respectively, connections of the switches therein may vary.

In this embodiment, the gain adjustment circuit 130 may comprise a fourth resistor such as a resistor R9. When the gain adjustment circuit 130 is enabled, the resistor R9 is coupled between the node N12 and the node N22. When the gain adjustment circuit 130 is disabled, the node N12 is prevented from connecting to the node N22 via the resistor R9. In this embodiment, the gain adjustment circuit 130 may comprise switches S91 and S92 for controlling whether to enable the gain adjustment circuit 130. For example, when the switches S91 and S92 are turned on, the gain adjustment circuit 130 may be enabled. When the switches S91 and S92 are turned off, the gain adjustment circuit 130 may be disabled. It should be noted that switches for controlling whether to enable the gain adjustment circuit 130 do not have to be implemented in the exact way of the switches S91 and S92 shown in FIG. 2. As long as a network within the gain adjustment circuit 130 has a corresponding configuration to those mentioned above under the conditions of being enabled and disabled, respectively, connections of the switches therein may vary. In some embodiment, if certain components within the bias signal generator 110 and the gain adjustment circuits 120, 130 and 140 must be adopted and kept enabled, the aforementioned switches for controlling whether to enable these components may be omitted (e.g. these components may be kept at a connected state of enablement), but the present invention is not limited thereto.

In this embodiment, the gain adjustment circuit 140 may comprise a positive second capacitor such as a capacitor C12, and a negative second capacitor such as a capacitor C22 (e.g. the capacitors C12 and C22 may have a same capacitance). When the gain adjustment circuit 140 is enabled, the capacitor C12 is coupled to the positive output terminal Nout1, and the capacitor C22 is coupled to the negative output terminal Nout2. When the gain adjustment circuit 140 is disabled, the capacitor C12 is prevented from being coupled to the positive output terminal Nout1, and the capacitor C22 is prevented from being coupled to the negative output terminal Nout2. In this embodiment, the gain adjustment circuit 140 may comprise switches S14 and S24 for controlling whether to enable the gain adjustment circuit 140. For example, when the switches S14 and S24 are turned on, the gain adjustment circuit 140 may be enabled. When the switches S14 and S24 are turned off, the gain adjustment circuit 140 may be disabled. It should be noted that switches for controlling whether to enable the gain adjustment circuit 140 do not have to be implemented in the exact way of the switches S14 and S24 shown in FIG. 2. As long as a network within the gain adjustment circuit 140 has corresponding configurations to those mentioned above under the conditions of being enabled and disabled, respectively, connections of the switches therein may vary.

In addition, any component (e.g. any resistor or any capacitor) within the receiver termination circuit 100 may be implemented by an adjustable component (e.g. an adjustable resistor or an adjustable capacitor), but the present invention is not limited thereto.

In some embodiments, the positive control signal and the negative control signal output from the bias signal generator 110 may be currents positively correlated with a voltage level of a second reference voltage terminal (e.g. the voltage level of the supply voltage VDD1)

Figure 3:
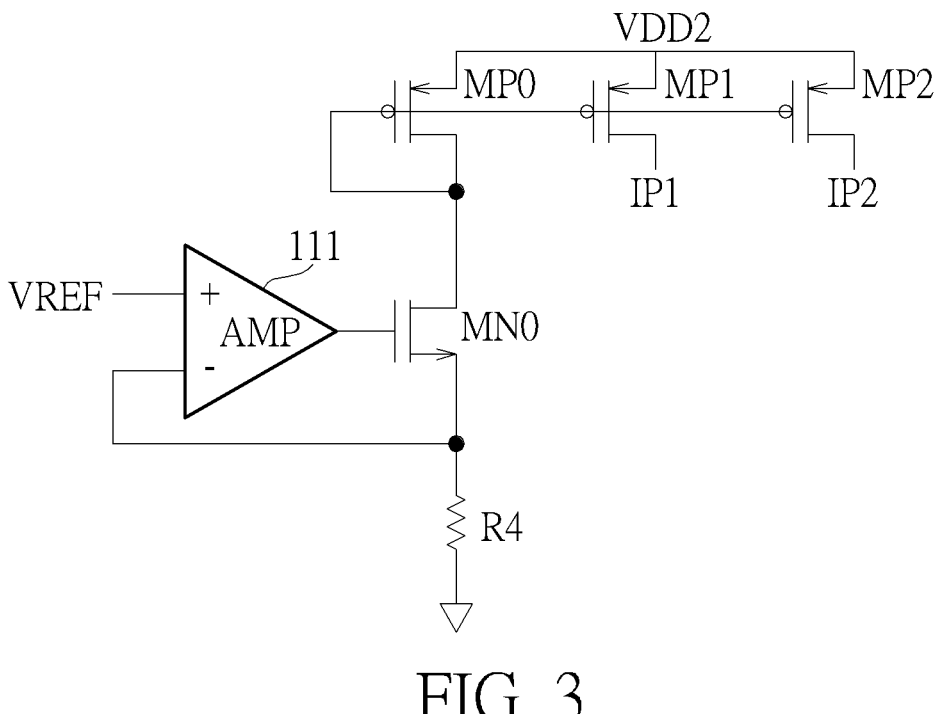
FIG. 3 is a diagram illustrating a first scheme of a bias signal generator according to an embodiment of the present invention.

FIG. 3 is a diagram illustrating a first scheme of the bias signal generator 110 according to an embodiment of the present invention. In this embodiment, the bias signal generator 110 may comprise a resistor R4, an N-type transistor MNO, an amplifier 111 (labeled "AMP" in FIG. 3 for brevity), and P-type transistors MP0, MP1 and MP2. A shown in FIG. 3, a source electrode of the N-type transistor MNO is coupled to the resistor R4. A first input terminal (a terminal labeled "+" in FIG. 3) of the amplifier 111 is configured to receiver a reference voltage VREF, and a second input terminal (a terminal labeled "−" in FIG. 3) of the amplifier 111 is coupled to the source electrode of the N-type transistor MNO, where an output terminal of the amplifier 111 is coupled to a gate electrode of the N-type transistor MNO. In addition, a drain electrode of the P-type transistor MP0 is coupled to a gate electrode of the P-type transistor MP0 and a drain electrode of the N-type transistor MNO. A gate electrode of the P-type transistor MP1 is coupled to the gate electrode of the P-type transistor MP0, and a control current IP1 output from a drain electrode of the P-type transistor MP1 may be taken as the positive control signal. A gate electrode of the P-type transistor MP2 is coupled to the gate electrode of the P-type transistor MP0, and a control current IP2 output from a drain electrode of the P-type transistor MP2 is taken as the negative control signal. In this embodiment, a voltage level of the reference voltage VREF may be positively correlated with the voltage level of the supply voltage VDD1. For example, the supply voltage VDD1 may be transmitted to the first input terminal of the amplifier 111 (i.e. VREF=VDD1), and the control current IP1 output from the P-type transistor MP1 and the control current IP2 output from the P-type transistor MP2 are both equal to (VDD1/R4). In another example, the reference voltage VREF may be generated according to the supply voltage VDD1, a reference current IBG (not shown) and a reference resistor RBG (not shown), to make VREF=VDD1−IBG×RBG, and the control current IP1 output from the P-type transistor MP1 and the control current IP2 output from the P-type transistor MP2 are both equal to ((VDD1−IBG×RBG)/R4).

Figure 4:
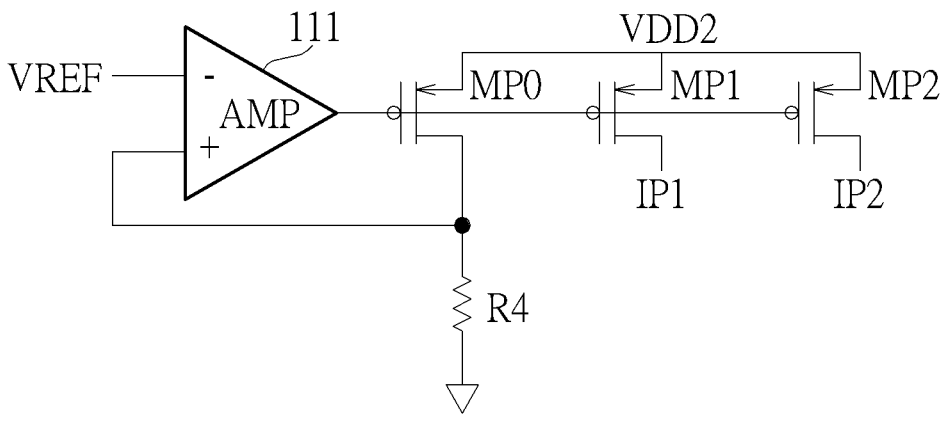
FIG. 4 is a diagram illustrating a second scheme of a bias signal generator according to an embodiment of the present invention.

FIG. 4 is a diagram illustrating a second scheme of the bias signal generator 110 according to an embodiment of the present invention. In this embodiment, the bias signal generator 110 may comprise the resistor R4, the amplifier 111 (labeled "AMP" in FIG. 4 for brevity), and the P-type transistors MP0, MP1 and MP2. As shown in FIG. 4, the first input terminal (the terminal labeled "+" in FIG. 4) of the amplifier 111 is coupled to the resistor R4, and the second input terminal (the terminal labeled "−" in FIG. 4) of the amplifier 111 is configured to receive the reference voltage VREF. In addition, the gate electrode of the P-type transistor MP0 is coupled to the output terminal of the amplifier 111, and the drain electrode of the P-type transistor MP0 is coupled to the first input terminal of the amplifier 111. The gate electrode of the P-type transistor MP1 is coupled to the gate electrode of the P-type transistor MP0, and the control current IP1 output from the drain electrode of the P-type transistor MP1 may be taken as the positive control signal. The gate electrode of the P-type transistor MP2 is coupled to the gate electrode of the P-type transistor MP0, and the control current IP2 output from the drain electrode of the P-type transistor MP2 may be taken as the negative control signal. In this embodiment, the voltage level of the reference voltage VREF may be positively correlated with the voltage level of the supply voltage VDD1. For example, the supply voltage VDD1 may be transmitted to the second input terminal of the amplifier 111 (i.e. VREF=VDD1), and the control current IP1 output from the P-type transistor MP1 and the control current IP2 output from the P-type transistor MP2 are both equal to (VDD1/R4). In another example, the reference voltage VREF may be generated according to the supply voltage VDD1, the reference current IBG (not shown) and the reference resistor RBG (not shown), to make VREF=VDD1−IBG×RBG, and the control current IP1 output from the P-type transistor MP1 and the control current IP2 output from the P-type transistor MP2 are both equal to ((VDD1−IBG×RBG)/R4).

In some embodiments, the positive control signal and the negative control signal output from the bias signal generator 110 may be voltages positively correlated with the voltage level of the second reference voltage terminal (e.g. the voltage level of the supply voltage VDD1).

Figures 5, 6:
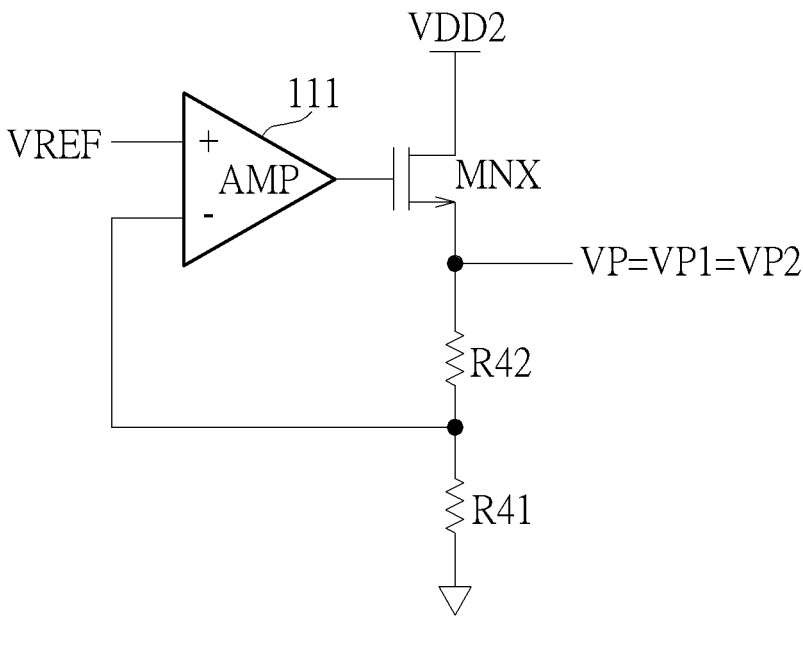
FIG. 5 is a diagram illustrating a third scheme of a bias signal generator according to an embodiment of the present invention.
FIG. 6 is a diagram illustrating a fourth scheme of a bias signal generator according to an embodiment of the present invention.

FIG. 5 is a diagram illustrating a third scheme of the bias signal generator 110 according to an embodiment of the present invention. In this embodiment, the bias signal generator 110 may comprise the amplifier 111 (labeled "AMP" in FIG. 5 for brevity), an N-type transistor MNX, and resistors R41 and R42. As shown in FIG. 5, the first input terminal (the terminal labeled "+" in FIG. 5) is configured to receive the reference voltage VREF, where a gate electrode of the N-type transistor MNX is coupled to the output terminal of the amplifier 111, and a control voltage VP output from a source electrode of the N-type transistor MNX is taken as the positive control signal (e.g. a control voltage VP1) and the negative control signal (e.g. a control voltage VP2). In addition, the resistor R41 is coupled between the second input terminal (the terminal labeled "−" in FIG. 5) of the amplifier 111 and the first reference voltage terminal (e.g. the terminal providing the ground voltage GND), and the resistor R42 is coupled between a source electrode of the N-type transistor NMX and the second input terminal of the amplifier 111. In this embodiment, the voltage level of the reference voltage VREF may be positively correlated with the voltage level of the supply voltage VDD1. For example, the supply voltage VDD1 may be transmitted to the first input terminal of the amplifier 111 (i.e. VREF=VDD1), and the control voltage VP is equal to (VDD1×(R41+R42)/R41). In another example, the reference voltage VREF may be generated according to the supply voltage VDD1, the reference current IBG (not shown) and the reference resistor RBG (not shown), to make VREF=VDD1−IBG×RBG, and the control voltage VP is equal to ((VDD1−IBG×RBG)×(R41+R42)/R41).

FIG. 6 is a diagram illustrating a fourth scheme of the bias signal generator 110 according to an embodiment of the present invention. In this embodiment, the bias signal generator 110 may comprise the amplifier 111 (labeled "AMP" in FIG. 6 for brevity), a P-type transistor MPX, and the resistors R41 and R42. As shown in FIG. 6, the second input terminal (the terminal labeled "−" in FIG. 6) is configured to receive the reference voltage VREF, where a gate electrode of the P-type transistor MPX is coupled to the output terminal of the amplifier 111, and the control voltage VP output from a drain electrode of the P-type transistor MPX may be taken as the positive control signal (e.g. the control voltage VP1) and the negative control signal (e.g. the control voltage VP2). In addition, the resistor R41 is coupled between the first input terminal (the terminal labeled "+" in FIG. 6) of the amplifier 111 and the first reference voltage terminal (e.g. the terminal providing the ground voltage GND), and the resistor R42 is coupled between the drain electrode of the P-type transistor MPX and the first input terminal of the amplifier 111. In this embodiment, the voltage level of the reference voltage VREF may be positively correlated with the voltage level of the supply voltage VDD1. For example, the supply voltage VDD1 may be transmitted to the second input terminal of the amplifier 111 (i.e. VREF=VDD1), and the control voltage VP is equal to (VDD1×(R41+R42)/R41). In another example, the reference voltage VREF may be generated according to the supply voltage VDD1, the reference current IBG (not shown) and the reference resistor RBG (not shown), to make VREF=VDD1−IBG×RBG, and the control voltage VP is equal to ((VDD1−IBG×RBG)×(R41+R42)/R41).

Figure 7:
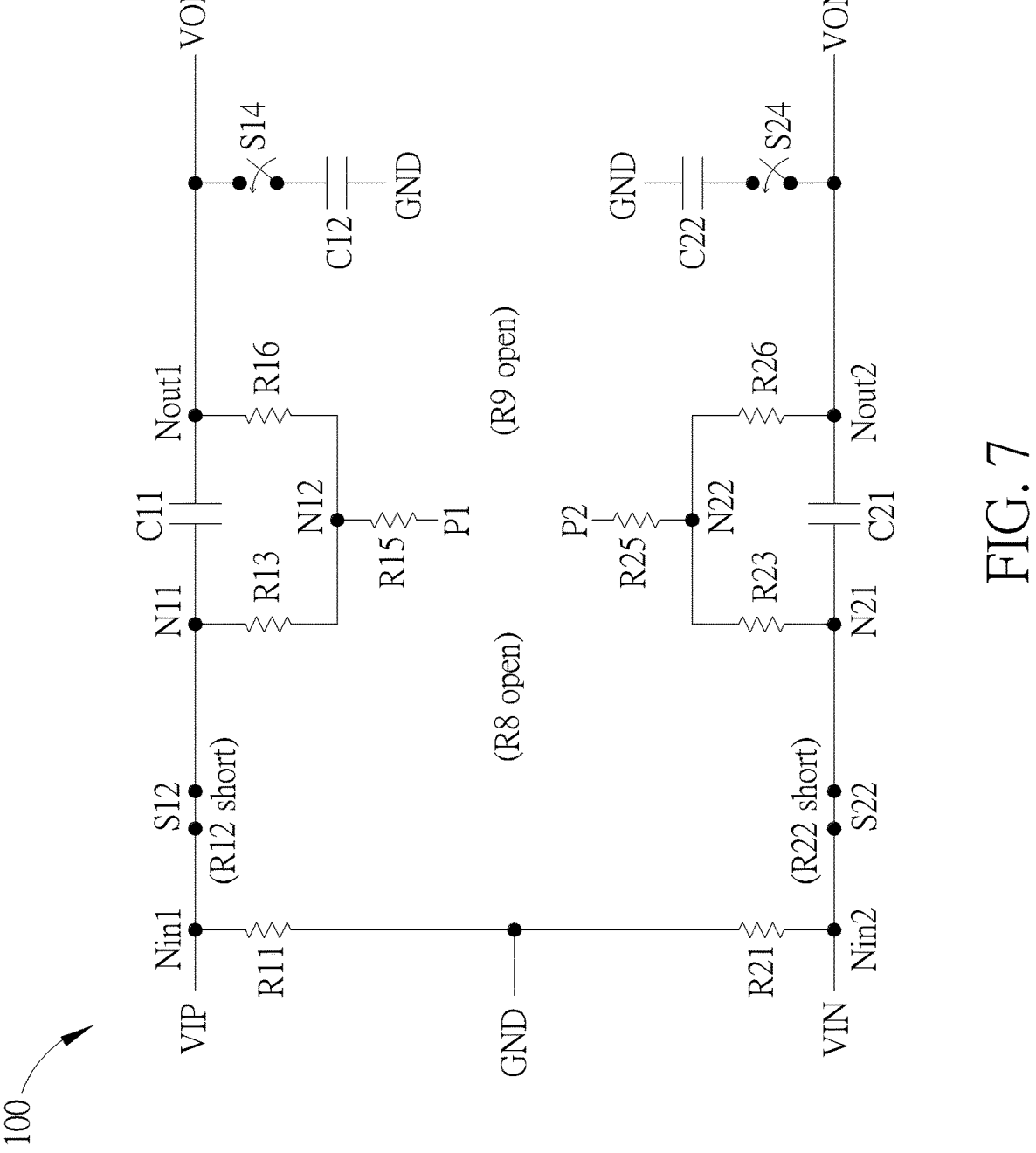
FIG. 7 is a diagram illustrating at least one configuration of the termination circuit shown in FIG. 2 according to an embodiment of the present invention.

FIG. 7 is a diagram illustrating at least one configuration of the receiver termination circuit 100 shown in FIG. 2 according to an embodiment of the present invention, where this embodiment illustrates influence on the receiver termination circuit 100 caused by different configurations of the gain adjustment circuit 140 under a condition where the gain adjustment circuit 120 and 130 are disabled. In addition, FIG. 7 does not show the bias signal generator 110 for brevity. In detail, the gain adjustment circuit 120 is configured to concurrently reduce the DC gain and the AC gain of the receiver termination circuit 100 without affecting the common mode voltage of the signals {VOP, VON}, the gain adjustment circuit 130 is configured to reduce the DC gain of the receiver termination circuit 100 without affecting the common mode voltage of the signals {VOP, VON} and the AC gain of the receiver termination circuit 100, and the gain adjustment circuit 140 may adjust the AC gain of the receiver termination circuit 100 without affecting the common mode voltage of the signals {VOP, VON} and the DC gain of the receiver termination circuit 100. Thus, when the gain adjustment circuit 120 is disabled (i.e. the switches S12 and S22 are turned on and the switches S81 and S82 are turned off, labeled "R12 short", "R22 short" and "R8 open"), the gain adjustment circuit 130 is disabled (i.e. the switches S91 and S92 are turned off, labeled "R9 open") and the gain adjustment circuit 140 is disabled (i.e. the switches S14 and S24 are turned off), both the DC gain and the AC gain of the receiver termination circuit 100 may be maximized (e.g. having a maximum DC gain and a maximum AC gain). It should be noted that when the control terminals P1 and P2 respectively receive the control currents IP1 and IP2 that are positively correlated with the supply voltage VDD1 (e.g. the bias signal generator 110 is implemented based on the architecture shown in FIG. 3 or FIG. 4), the common mode voltage of the signals {VOP, VON} may be expressed by (IP1×(R11+R13)), the DC gain (e.g. the maximum DC gain mentioned above) of the receiver termination circuit 100 is approximately equal to 1, and the AC gain (e.g. the maximum AC gain mentioned above) of the receiver termination circuit 100 is approximately equal to 1. In addition, when the control terminals P1 and P2 respectively receive the control voltages VP1 and VP2 that are positively correlated with the supply voltage VDD1 (e.g. the bias signal generator 110 is implemented based on the architecture shown in FIG. 5 or FIG. 6), the common mode voltage of the signals {VOP, VON} may be expressed by (VP1×(R11+R13)/(R11+R13+R15)), the DC gain (e.g. the maximum DC gain mentioned above) of the receiver termination circuit 100 may be expressed by (R15/(R13+R15)), and the AC gain (e.g. the maximum AC gain mentioned above) of the receiver termination circuit 100 is approximately equal to 1.

In addition, when the gain adjustment circuit 120 is disabled (i.e. the switches S12 and S22 are turned on and the switches S81 and S82 are turned off, labeled "R12 short", "R22 short" and "R8 open"), the gain adjustment circuit 130 is disabled (i.e. the switches S91 and S92 are turned off, labeled "R9 open") and the gain adjustment circuit 140 are enabled (i.e. the switches S14 and S24 are turned on), the DC gain of the receiver termination circuit 100 may be maximized, and in comparison with the maximum AC gain mentioned above, the AC gain of the receiver termination circuit 100 may be reduced, making the receiver termination circuit 100 able to provide an effect similar to low pass filtering without changing the common mode voltage of the signals {VOP, VON}. For example, when the control terminals P1 and P2 respectively receive the control currents IP1 and IP2 that are positively correlated with the supply voltage VDD1 (e.g. the bias signal generator 110 is implemented based on the architecture shown in FIG. 3 or FIG. 4), the common mode voltage of the signals {VOP, VON} may be expressed by (IP1×(R11+R13)), the DC gain (e.g. the maximum DC gain mentioned above) of the receiver termination circuit 100 is approximately equal to 1, and the AC gain of the receiver termination circuit 100 is approximately equal to (C11/(C11+C12)). In addition, when the control terminals P1 and P2 respectively receive the control voltages VP1 and VP2 that are positively correlated with the supply voltage VDD1 (e.g. the bias signal generator 110 is implemented based on the architecture shown in FIG. 5 or FIG. 6), the common mode voltage of the signals {VOP, VON} may be expressed by (VP1×(R11+R13)/(R11+R13+R15)), the DC gain (e.g. the maximum DC gain mentioned above) of the receiver termination circuit 100 may be expressed by (R15/(R13+R15)), and the AC gain of the receiver termination circuit 100 is approximately equal to (C11/(C11+C12)).

Figure 8:
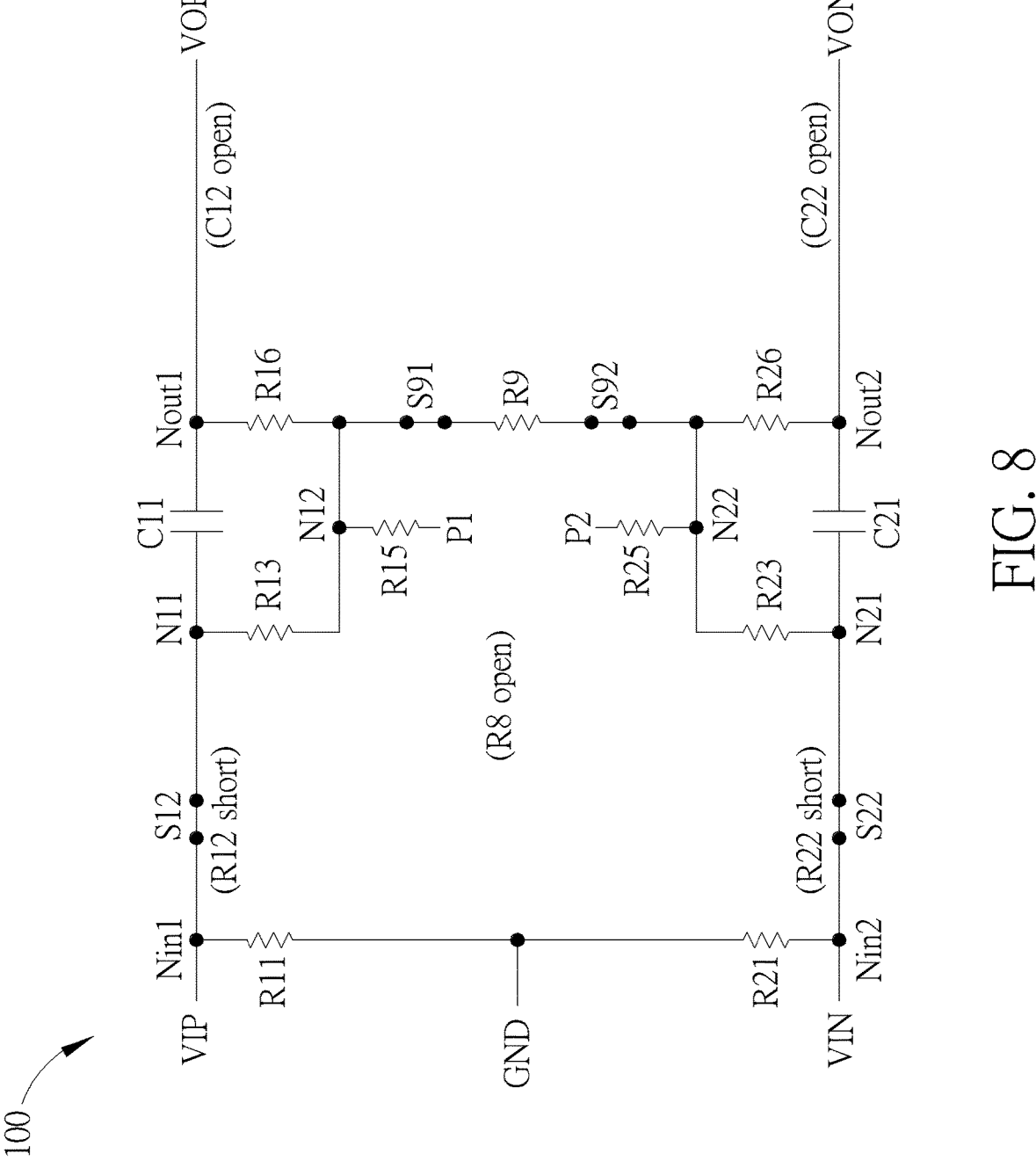
FIG. 8 is a diagram illustrating at least one configuration of the termination circuit shown in FIG. 2 according to another embodiment of the present invention.

FIG. 8 is a diagram illustrating at least one configuration of the receiver termination circuit 100 shown in FIG. 2 according to another embodiment of the present invention, where FIG. 8 does not show the bias signal generator 110 for brevity. In this embodiment, the gain adjustment circuit 120 is disabled (i.e. the switches S12 and S22 are turned on and the switches S81 and S82 are turned off, labeled "R12 short", "R22 short" and "R8 open"), the gain adjustment circuit 130 is enabled (i.e. the switches S91 and S92 are turned on) and the gain adjustment circuit 140 is disabled (i.e. the switches S14 and S24 are turned off, labeled "C12 open" and "C22 open"). Thus, the AC gain of the receiver termination circuit 100 may be maximized (e.g. having the maximum AC gain mentioned above), and in comparison with the maximum DC gain mentioned above, the DC gain of the receiver termination circuit 100 may be reduced, making the receiver termination circuit 100 able to provide an effect similar to passive equalization. More particularly, by adjusting the resistance of the resistor R9, the DC gain of the receiver termination circuit 100 may be accordingly adjusted, and the common mode voltage of the signals {VOP, VON} and the AC gain of the receiver termination circuit 100 may keep unchanged. For example, when the control terminals P1 and P2 respectively receive the control currents IP1 and IP2 that are positively correlated with the supply voltage VDD1 (e.g. the bias signal generator 110 is implemented based on the architecture shown in FIG. 3 or FIG. 4), the common mode voltage of the signals {VOP, VON} may be expressed by (IP1×(R11+R13)), the DC gain of the receiver termination circuit 100 may be expressed by ((0.5×R9)/(R13+0.5×R9)), and the AC gain (e.g. the maximum AC gain mentioned above) of the receiver termination circuit 100 is approximately equal to 1. In addition, when the control terminals P1 and P2 respectively receive the control voltages VP1 and VP2 that are positively correlated with supply voltage VDD1 (e.g. the bias signal generator 110 is implemented based on the architecture shown in FIG. 5 or FIG. 6), the common mode voltage of the signals {VOP, VON} may be expressed by (VP1×(R11+R13)/(R11+R13+R15)), the DC gain of the receiver termination circuit 100 may be expressed by (R15//(0.5×R9))/(R13+(R15//(0.5×R9)))) ("//" may represent an operator of calculating an equivalent resistance of two resistors connected in parallel), and the AC gain (e.g. the maximum AC gain mentioned above) of the receiver termination circuit 100 is approximately equal to 1.

Figure 9:
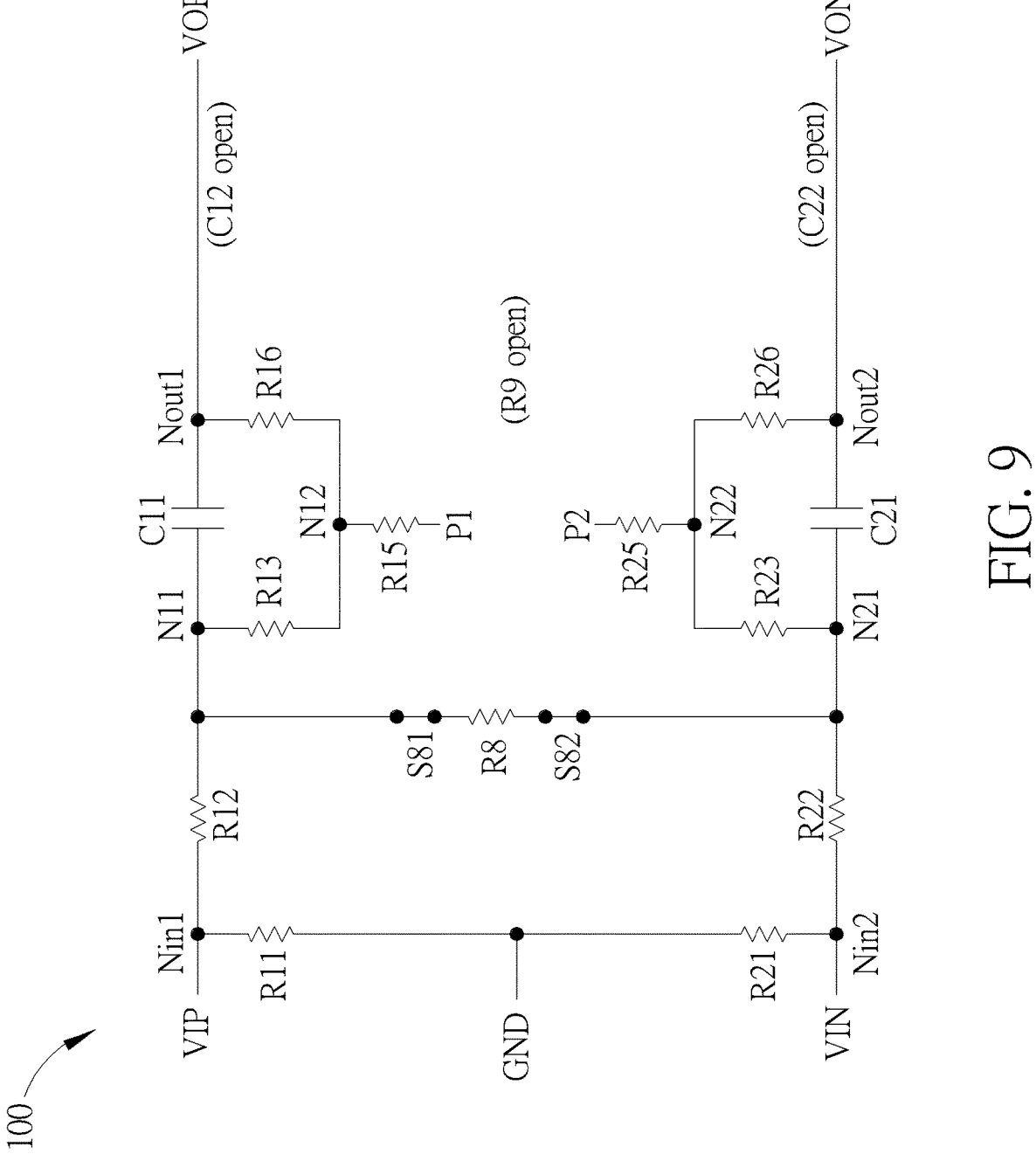
FIG. 9 is a diagram illustrating at least one configuration of the termination circuit shown in FIG. 2 according to another embodiment of the present invention.

FIG. 9 is a diagram illustrating at least one configuration of the receiver termination circuit 100 shown in FIG. 2 according to another embodiment of the present invention, where FIG. 9 does not show the bias signal generator 110 for brevity. In this embodiment, the gain adjustment circuit 120 is enabled (i.e. the switches S12 and S22 are turned off and the switches S81 and S82 are turned on), the gain adjustment circuit 130 is disabled (i.e. the switches S91 and S92 are turned off, labeled "R9 open") and the gain adjustment circuit 140 is disabled (i.e. the switches S14 and S24 are turned off, labeled "C12 open" and "C22 open"). Thus, in comparison with the maximum DC gain and the maximum AC gain mentioned above, the DC gain and the AC gain of the receiver termination circuit 100 may be concurrently reduced, making the whole signal be reduced. More particularly, by adjusting the resistance of the resistor R8, the DC gain and the AC gain of the receiver termination circuit 100 may be accordingly and concurrently adjusted, and the common mode voltage of the signals {VOP, VON} may keep unchanged. For example, when the control terminals P1 and P2 respectively receive the control currents IP1 and IP2 that are positively correlated with the supply voltage VDD1 (e.g. the bias signal generator 110 is implemented based on the architecture shown in FIG. 3 or FIG. 4), the common mode voltage of the signals {VOP, VON} may be expressed by (IP1×(R11+R12+R13)), the DC gain of the receiver termination circuit 100 may be expressed by ((0.5× R8)/(R12+0.5×R8)), and the AC gain (e.g. the maximum AC gain mentioned above) of the receiver termination circuit 100 is approximately equal to ((0.5×R8)/(R12+0.5×R8)). In addition, when the control terminals P1 and P2 respectively receive the control voltages VP1 and VP2 that are positively correlated with the supply voltage VDD1 (e.g. the bias signal generator 110 is implemented based on the architecture shown in FIG. 5 or FIG. 6), the common mode voltage of the signals {VOP, VON} may be expressed by (VP1× (R11+R12+R13)/(R11+R12+R13+R15)), the DC gain of the receiver termination circuit 100 may be expressed by (((0.5× R8)/(R12+0.5×R8))×(R15/(R13+R15))), and the AC gain (e.g. the maximum AC gain mentioned above) of the receiver termination circuit 100 is approximately equal to ((0.5×R8)/(R12+0.5×R8)).

Figure 10:
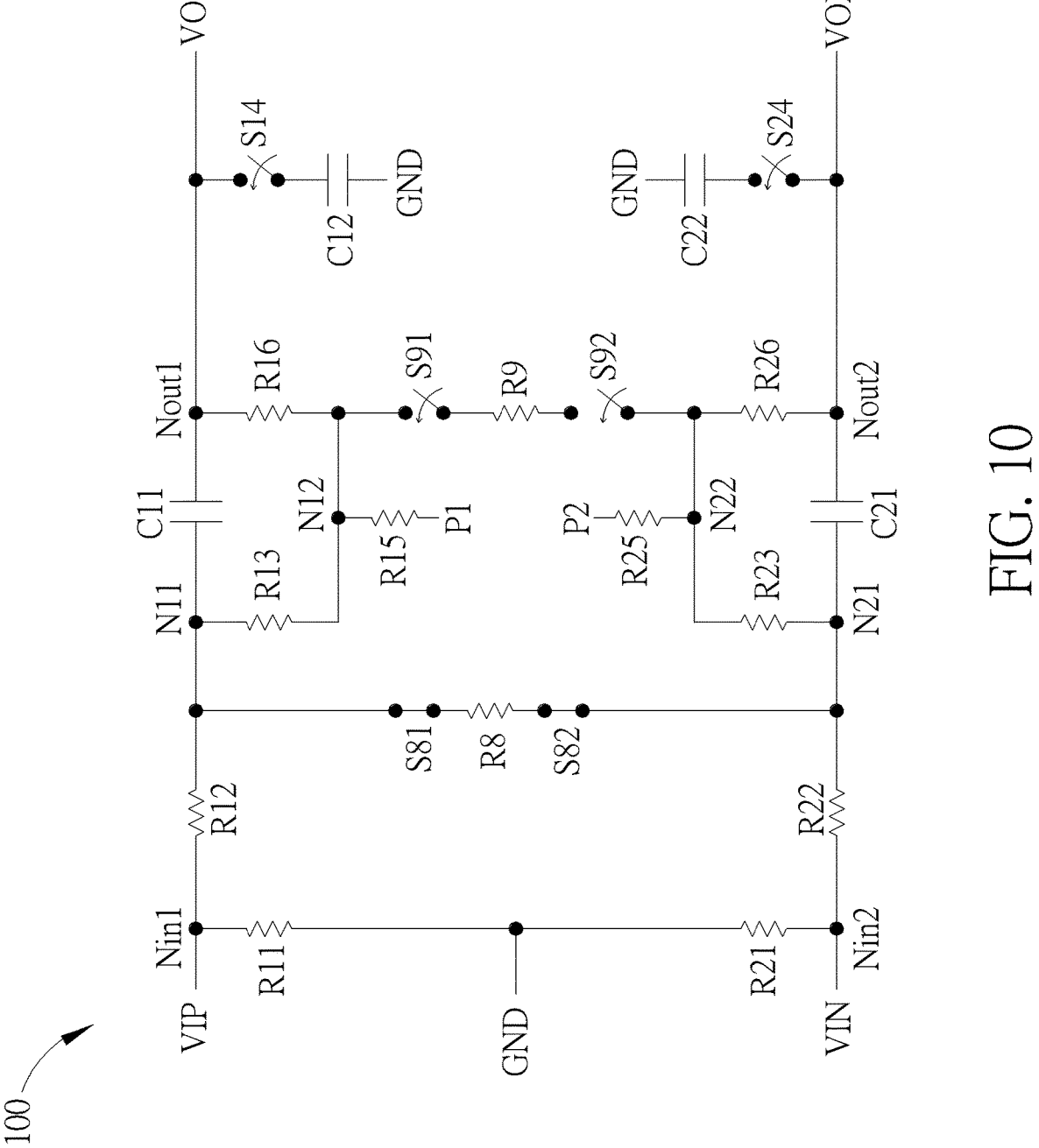
FIG. 10 is a diagram illustrating at least one configuration of the termination circuit shown in FIG. 2 according to another embodiment of the present invention.

FIG. 10 is a diagram illustrating at least one configuration of the receiver termination circuit 100 shown in FIG. 2 according to another embodiment of the present invention, where this embodiment illustrates influence on the receiver termination circuit 100 caused by different configurations of the gain adjustment circuit 130 and the gain adjustment circuit 140 under a condition where the gain adjustment circuit 120 is enabled. In addition, FIG. 10 does not show the bias signal generator 110 for brevity. When the gain adjustment circuit 120 is enabled (i.e. the switches S12 and S22 are turned off and the switches S81 and S82 are turned on), the gain adjustment circuit 130 is disabled (i.e. the switches S91 and S92 are turned off to prevent the resistor R9 from taking effects) and the gain adjustment circuit 140 is enabled (i.e. the switches S14 and S24 are turned on), in comparison with the maximum DC gain and the maximum AC gain mentioned above, the DC gain and the AC gain of the receiver termination circuit 100 may be concurrently reduced, and more particularly, the AC gain of the receiver termination circuit 100 may be further reduced in response to adjustment on the capacitors C12 and C22 under a condition where the common mode voltage of the signals {VOP, VON} keeps unchanged.

In addition, when the gain adjustment circuit 120 is enabled (i.e. the switches S12 and S22 are turned off and the switches S81 and S82 are turned on), the gain adjustment circuit 130 is enabled (i.e. the switches S91 and S92 are turned on) and the gain adjustment circuit 140 is disabled (i.e. the switches S14 and S24 are turned off to prevent the capacitors C12 and C22 from taking effects), in comparison with the maximum DC gain and the maximum AC gain mentioned above, the DC gain and the AC gain of the receiver termination circuit 100 may be concurrently reduced, and more particularly, the DC gain of the receiver termination circuit 100 may be further reduced in response to adjustment on the resistor R9 under a condition where the common mode voltage of the signals {VOP, VON} remains unchanged.

To summarize, the termination circuit provided by the embodiments of the present invention can adjust the output common mode voltage in response to the voltage level of the supply voltage of back-stage circuit(s), to ensure that transistors within the back-stage circuit(s) are able to operate in wanted region(s). In addition, the embodiments of the present invention provide various gain adjustment circuits in response to various different requirements, and more particularly, can prevent the output common mode voltage from being affected during the gain adjustment.

Those skilled in the art will readily observe that numerous modifications and alterations of the device and method may be made while retaining the teachings of the invention. Accordingly, the above disclosure should be construed as limited only by the metes and bounds of the appended claims.

13

14

What is claimed is:

1. A termination circuit of a receiver, wherein the termination circuit is configured to perform adjustment upon input signals to generate output signals for a backend circuit, and the termination circuit comprises:

a positive input resistor and a negative input resistor, wherein the positive input resistor is coupled between a positive input terminal of the termination circuit and a first reference voltage terminal, and the negative input resistor is coupled between a negative input terminal of the termination circuit and the first reference voltage terminal;

a positive first capacitor and a negative first capacitor, wherein the positive first capacitor is coupled between a positive first node of the termination circuit and a positive output terminal of the termination circuit, and the negative first capacitor is coupled between a negative first node of the termination circuit and a negative output terminal of the termination circuit;

a positive first resistor and a negative first resistor, wherein the positive first resistor is coupled between the positive first node and a positive second node of the termination circuit, and the negative first resistor is coupled between the negative first node and a negative second node of the termination circuit;

a positive second resistor and a negative second resistor, wherein the positive second resistor is coupled between the positive second node and the positive output terminal, and the negative second resistor is coupled between the negative second node and the negative output terminal;

a positive third resistor and a negative third resistor, wherein the positive third resistor is coupled between the positive second node and a positive control terminal of the termination circuit, and the negative third resistor is coupled between the negative second node and a negative control terminal of the termination circuit; and a bias signal generator, coupled to the positive control terminal and the negative control terminal, configured to generate a positive control signal and a negative control signal to be transmitted to the positive control terminal and the negative control terminal according to a voltage level of a second reference voltage terminal of the backend circuit, wherein the positive control signal and the negative control signal are positively correlated with the voltage level of the second reference voltage terminal.

2. The termination circuit of claim 1, wherein the positive control signal and the negative control signal are currents positively correlated with the voltage level of the second reference voltage terminal.

3. The termination circuit of claim 1, wherein the positive control signal and the negative control signal are voltages positively correlated with the voltage level of the second reference voltage terminal.

4. The termination circuit of claim 1, wherein the bias signal generator comprises:

a resistor;

an N-type transistor, wherein a source electrode of the N-type transistor is coupled to the resistor;

an amplifier, wherein a first input terminal of the amplifier is configured to receive a reference voltage, a second input terminal of the amplifier is coupled to the source electrode of the N-type transistor, and an output terminal of the amplifier is coupled to a gate electrode of the N-type transistor;

a first P-type transistor, wherein a drain electrode of the first P-type transistor is coupled to a gate electrode of the first P-type transistor and a drain electrode of the N-type transistor;

a second P-type transistor, wherein a gate electrode of the second P-type transistor is coupled to the gate electrode of the first P-type transistor, and a current output from a drain electrode of the second P-type transistor is taken as the positive control signal; and a third P-type transistor, wherein a gate electrode of the third P-type transistor is coupled to the gate electrode of the first P-type transistor, and a current output from a drain electrode of the third P-type transistor is taken as the negative control signal;

wherein a voltage level of the reference voltage is positively correlated with the voltage level of the second reference voltage terminal.

5. The termination circuit of claim 1, wherein the bias signal generator comprises:

a resistor;

an amplifier, wherein a first input terminal of the amplifier is coupled to the resistor, and a second input terminal of the amplifier is configured to receive a reference voltage;

a first P-type transistor, wherein a gate electrode of the first P-type transistor is coupled to an output terminal of the amplifier, and a drain electrode of the first P-type transistor is coupled to the first input terminal of the amplifier;

a second P-type transistor, wherein a gate electrode of the second P-type transistor is coupled to the gate electrode of the first P-type transistor, and a current output from a drain electrode of the second P-type transistor is taken as the positive control signal; and a third P-type transistor, wherein a gate electrode of the third P-type transistor is coupled to the gate electrode of the first P-type transistor, and a current output from a drain electrode of the third P-type transistor is taken as the negative control signal;

wherein a voltage level of the reference voltage is positively correlated with the voltage level of the second reference voltage terminal.

6. The termination circuit of claim 1, wherein the bias signal generator comprises:

an amplifier, wherein a first input terminal of the amplifier is configured to receive a reference voltage;

an N-type transistor, wherein a gate electrode of the N-type transistor is coupled to an output terminal of the amplifier, and a voltage output from a source electrode of the N-type transistor is taken as the positive control signal and the negative control signal;

a first resistor, coupled between a second input terminal of the amplifier and the first reference voltage terminal; and a second resistor, coupled between the source electrode of the N-type transistor and the second input terminal of the amplifier;

wherein a voltage level of the reference voltage is positively correlated with the voltage level of the second reference voltage terminal.

7. The termination circuit of claim 1, wherein the bias signal generator comprises:

an amplifier, wherein a second input terminal of the amplifier is configured to receive a reference voltage;

a P-type transistor, wherein a gate electrode of the P-type transistor is coupled to an output terminal of the amplifier, and a voltage output from a drain electrode of the P-type transistor is taken as the positive control signal and the negative control signal;

a first resistor, coupled between a first input terminal of the amplifier and the first reference voltage terminal; and a second resistor, coupled between the drain electrode of the P-type transistor and the first input terminal of the amplifier;

wherein a voltage level of the reference voltage is positively correlated with the voltage level of the second reference voltage terminal.

8. The termination circuit of claim 1, further comprising:

a positive fourth resistor, coupled between the positive input terminal and the positive first node;

a negative fourth resistor, coupled between the negative input terminal and the negative first node; and a fifth resistor, coupled between the positive first node and the negative first node.

9. The termination circuit of claim 1, further comprising:

a fourth resistor, coupled between the positive second node and the negative second node.

10. The termination circuit of claim 1, further comprising:

a positive second capacitor, coupled to the positive output terminal; and a negative second capacitor, coupled to the negative output terminal.

* * * * *